(12) United States Patent
Yamada et al.

(10) Patent No.: US 9,519,022 B2
(45) Date of Patent: Dec. 13, 2016

(54) METHOD FOR PRE-HEATING PROBE CARD

(71) Applicant: TOKYO ELECTRON LIMITED, Tokyo (JP)

(72) Inventors: Hiroshi Yamada, Nirasaki (JP); Takaaki Hoshino, Nirasaki (JP); Shinji Kojima, Nirasaki (JP); Takeshi Saigusa, Nirasaki (JP); Hiroshi Shimoyama, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 112 days.

(21) Appl. No.: 14/680,718

(22) Filed: Apr. 7, 2015

(65) Prior Publication Data
US 2015/0219716 A1    Aug. 6, 2015

Related U.S. Application Data

(62) Division of application No. 13/231,341, filed on Sep. 13, 2011, now Pat. No. 9,201,115.

(30) Foreign Application Priority Data

Sep. 13, 2010 (JP) ................... 2010-204961
Mar. 4, 2011 (JP) ................... 2011-047247

(51) Int. Cl.
*G01R 31/28* (2006.01)

(52) U.S. Cl.
CPC ....... *G01R 31/2887* (2013.01); *G01R 31/2893* (2013.01); *G01R 31/2891* (2013.01)

(58) Field of Classification Search
None
See application file for complete search history.

(56) References Cited

U.S. PATENT DOCUMENTS

| 6,169,409 B1 | 1/2001 | Amemiya |
| 6,540,014 B2 | 4/2003 | Getchel |
| 6,771,090 B2 | 8/2004 | Harris |

(Continued)

FOREIGN PATENT DOCUMENTS

| CN | 101071764 A | 11/2007 |
| JP | H10-256323 A | 9/1998 |

(Continued)

*Primary Examiner* — Paresh Patel
(74) *Attorney, Agent, or Firm* — Nath, Goldberg & Meyer; Jerald L. Meyer

(57) ABSTRACT

A wafer inspection apparatus includes a first and second wafer transfer mechanisms, an alignment chamber, a second wafer transfer mechanism and a plurality of inspection chambers. The first wafer transfer mechanism is installed at a first transfer area to transfer wafers individually from a housing. The alignment chamber has an alignment mechanism configured to align the wafer at an inspection position for an electrical characteristics inspection. The second wafer transfer mechanism is configured to transfer the wafer through a wafer retaining support in a second transfer area formed along the first transfer area and an alignment area. The plurality of inspection chambers is arranged at an inspection area formed along the second transfer area and is configured to inspect electrical characteristics of the wafer transferred by the second wafer transfer mechanism through the wafer retaining support.

4 Claims, 17 Drawing Sheets

(56) References Cited

U.S. PATENT DOCUMENTS

| | | |
|---|---|---|
| 6,885,206 B2 | 4/2005 | Halley |
| 7,456,643 B2 * | 11/2008 | Johnson ............ G01R 1/07342 324/750.3 |
| 2002/0190740 A1 | 12/2002 | Ishizaka |
| 2008/0174326 A1 | 7/2008 | Jeon |
| 2008/0297186 A1 | 12/2008 | Chong |
| 2009/0058446 A1 | 3/2009 | Yamamoto |
| 2009/0237089 A1 | 9/2009 | Cho |

FOREIGN PATENT DOCUMENTS

| | | |
|---|---|---|
| JP | 11186349 A | 7/1999 |
| JP | 2010186998 A | 8/2010 |
| WO | 2010092672 A1 | 8/2010 |

* cited by examiner

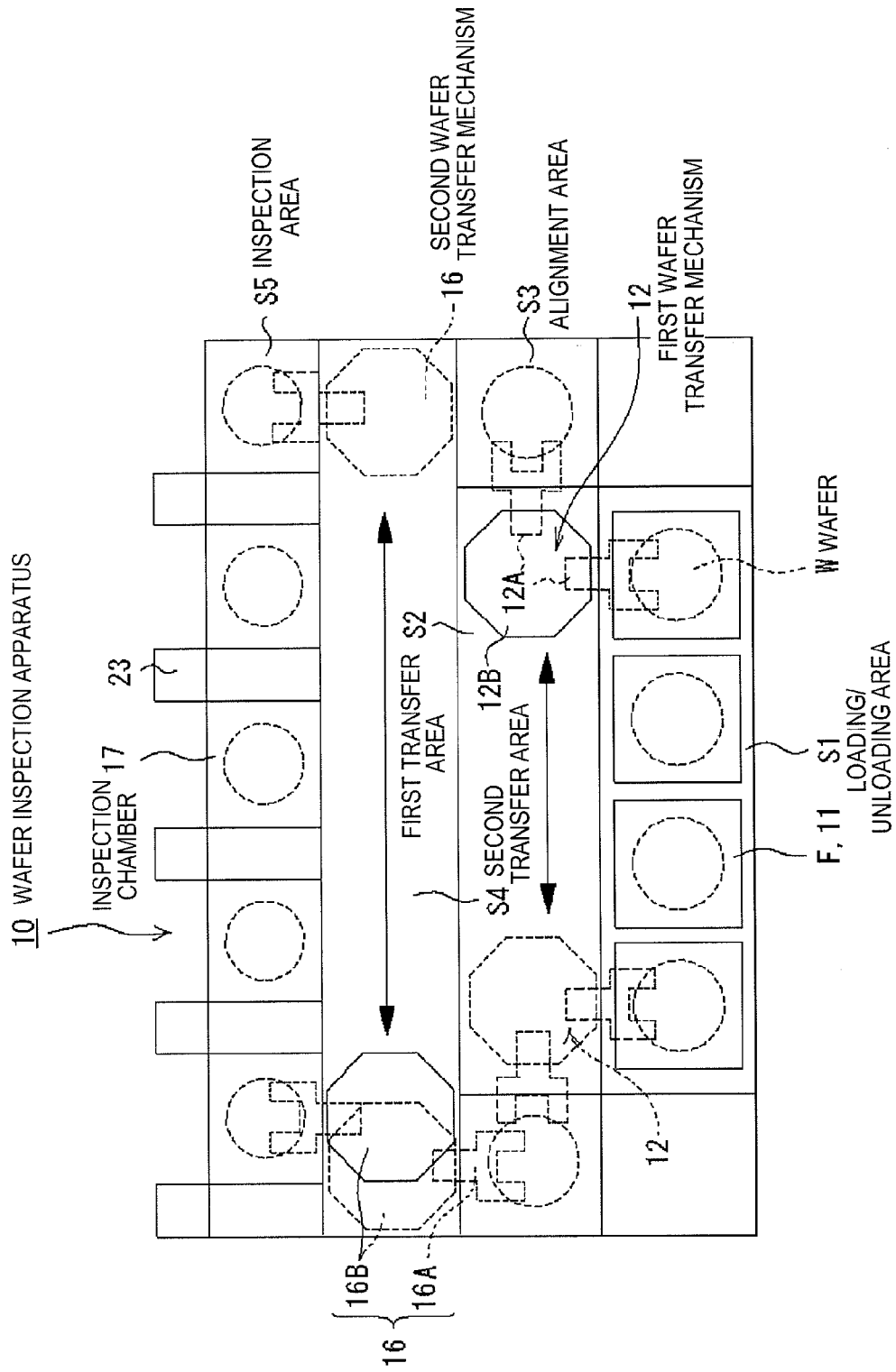

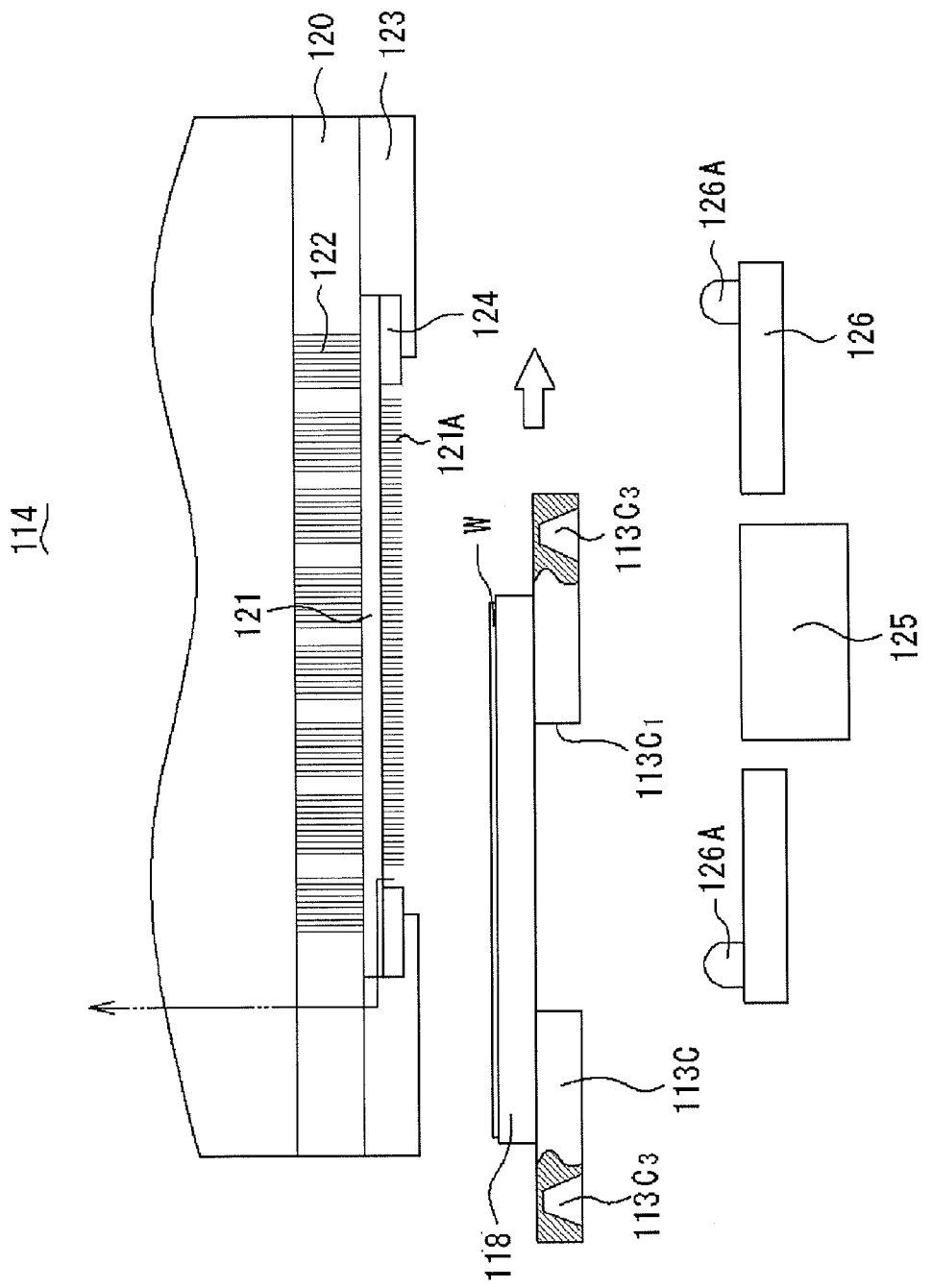

METHOD FOR PRE-HEATING PROBE CARD

CROSS-REFERENCE TO RELATED APPLICATIONS

This is a Divisional Application of U.S. patent application Ser. No. 13/231,341, filed Sep. 13, 2011, and claiming benefit from Japanese Application No. 2010-204961, filed Sep. 13, 2010, and Japanese Application No. 2011-47247, filed Mar. 4, 2011, the content of each of which is hereby incorporated by reference in its entirety.

TECHNICAL FIELD

The present disclosure relates to a wafer inspection apparatus for inspecting electrical characteristics of a wafer and a method for pre-heating a probe card.

BACKGROUND

A wafer inspection apparatus includes, for example, a probe apparatus for performing electrical characteristics inspection of a wafer by using a plurality of devices, a burn-in inspection apparatus for performing an acceleration inspection of a wafer, and the like.

The probe apparatus generally includes a loader chamber for transferring a wafer and an inspection chamber for inspecting electrical characteristics of the wafer, in which the electrical characteristics of the wafer are inspected by controlling various devices within the loader chamber and the inspection chamber by a control device. The loader chamber includes a cassette loading unit for loading wafers by cassette, a wafer transfer mechanism for transferring a wafer between a cassette and the inspection chamber, and a pre-alignment mechanism for performing pre-alignment of the wafer while the wafer transfer mechanism transfers the wafer. The inspection chamber includes a temperature-adjustable loading table for loading the wafer thereon from the loader chamber and moving the wafer in X, Y, Z, and θ directions, a probe card disposed at an upper side of the loading table, and an alignment mechanism for performing alignment of a plurality of probes of the probe card and a plurality of electrode pads of the wafer in cooperation with the loading table. After the loading table and the alignment mechanism align the wafer and the probe card in cooperation, electrical characteristics of the wafer are inspected at a certain temperature as necessary.

When the wafer is heated and inspected at a high temperature, the heated wafer is thermally expanded. This results in a position deviation between the electrode pads of the heated wafer and the probes of the unheated probe card. Thus, the electrode pads and the probes cannot accurately come in contact, and the reliability cannot be secured. In the conventional art, before inspecting the wafer, the probe card is pre-heated to secure contact between the electrode pads and the probes.

On the other hand, in the case of a burn-in inspection apparatus, a plurality of electrode pads of a wafer retained and supported by a wafer tray and a plurality of bumps of a probe sheet are aligned and then the wafer tray, the wafer, the probe sheet, and the like are integrated through vacuum adsorption so as to be assembled as a sheet of a card. Next, the card is transferred to be mounted in a burn-in unit, and the wafer acceleration inspection is performed at a certain high temperature within the burn-in unit.

However, the conventional probe apparatus has the following problems. For example, in order to align the plurality of electrode pads of the wafer and the plurality of probes of the probe card by using a camera of the alignment mechanism while moving the loading table in the XY direction, there is need for a space for the movement of the loading table and a space for the movement of the camera of the alignment mechanism. Therefore, the inspection chamber itself, which is a major part of the probe apparatus, occupies a considerably large space in three dimensions. Further, the loader chamber requires a space for the transfer of the wafer from the cassette to the inspection chamber. Thus, where a plurality of probe apparatuses are installed depending on device production capabilities, the plurality of conventional probe apparatuses, which are arranged on plane, occupy a large installation space, resulting in high cost. Moreover, independently of the burn-in unit, the burn-in apparatus requires an independent wafer transfer mechanism or card-integration device in order to vacuum-adsorb and integrate the wafer, the probe sheet, and the like.

Further, in the case where a high temperature inspection is performed on the wafer, the wafer is heated up to a certain temperature (e.g., 150° C.). However, in order to restrain a position deviation between the electrode pads of the heated and thermally expanded wafer and the unheated probe card, the probe card is pre-heated to be thermally expanded by using the loading table. In this case, however, in order to prevent the probes of the probe card from being damaged, the loading table is moved to be very close to the probe card, and the probe card is pre-heated in a state that the wafer and the probes of the probe card are not in contact. This prolongs the time required for pre-heating the probe card. Furthermore, after the probe card is pre-heated, the thermally expanded wafer and the probe card should be aligned.

SUMMARY

According to one embodiment of the present disclosure, a wafer inspection apparatus for inspecting electrical characteristics of a wafer by contacting a plurality of electrodes of the wafer with a plurality of probes of a probe card includes a loading mechanism, a wafer transfer mechanism, an alignment chamber and a plurality of inspection chambers. In the loading mechanism, housings for receiving a plurality of wafers in wafer loading/unloading area are arranged transversely. The wafer transfer mechanism is installed at a transfer area formed along the wafer loading/unloading area to transfer the wafers individually from each of the housings in the loading mechanism. The alignment chamber has an alignment mechanism configured to align the wafer, which is transferred by the wafer transfer mechanism through a wafer retaining support into an alignment area formed on at least one end portion of the loading mechanism. The plurality of inspection chambers are arranged at an inspection area formed along the transfer area and configured to inspect electrical characteristics of the wafer transferred by the wafer transfer mechanism through the wafer retaining support. The wafer aligned by the alignment mechanism is lifted or lowered in the inspection chamber to inspect electrical characteristics of the wafer.

According to another embodiment of the present disclosure, a wafer inspection apparatus for inspecting electrical characteristics of a wafer by contacting a plurality of electrodes of the wafer with a plurality of probes of a probe card includes a loading mechanism, a first wafer transfer mechanism, an alignment chamber, a second wafer transfer mechanism and a plurality of inspection chambers. In the loading mechanism, housings for receiving a plurality of wafers in wafer loading/unloading area are arranged transversely. The first wafer transfer mechanism is installed at a first transfer area formed along the wafer loading/unloading area to transfer the wafers individually from each of the housings in the loading mechanism. The alignment chamber has an alignment mechanism configured to align the wafer, which is transferred by the first wafer transfer mechanism through a wafer retaining support into an alignment area formed on at least one end portion of the first transfer area, at an inspection position for an electrical characteristics inspection. The second wafer transfer mechanism is configured to transfer the wafer through the wafer retaining support in a second transfer area formed along the first transfer area and the alignment area. The plurality of inspection chambers is arranged at an inspection area formed along the second transfer area and is configured to inspect electrical characteristics of the wafer transferred by the second wafer transfer mechanism through the wafer retaining support. The wafer aligned by the alignment mechanism is lifted or lowered in the inspection chamber to inspect electrical characteristics of the wafer.

According to yet another embodiment of the present disclosure, there is provided a method for pre-heating a probe card. For the method, there are provided an alignment chamber having an alignment mechanism configured to align a wafer at an inspection position for electrical characteristics inspection, and an inspection chamber configured to perform electrical characteristics inspection of the wafer. The inspection chamber includes a probe card having a plurality of probes, a sealing member surrounding the plurality of probes, a temperature-adjusting lifting body configured to lift the wafer and bring the wafer into contact with the sealing member, and an exhaustion mechanism vacuumizing a hermetically closed space formed by the wafer, the sealing member, and the probe card. The method uses the lifting body in the inspection chamber for electrical characteristics inspection of the wafer. The method includes lifting the wafer by the lifting body and bringing the wafer into contact with the sealing member; decompressing the interior of the hermetically closed space through the exhaustion mechanism to adsorb the wafer to the sealing member; and pre-heating the probe card having the plurality of probes.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 1 is a plan view of a wafer inspection apparatus according to an embodiment of the present disclosure.

FIGS. 2A and 2B illustrate the wafer inspection apparatus shown in FIG. 1, wherein FIG. 2A is a front perspective view and FIG. 2B is a rear perspective view.

FIGS. 12A and 12B illustrate another embodiment of the wafer inspection apparatus according to the present disclosure, wherein FIG. 12A is a plan view and FIG. 12B is a front perspective view.

FIG. 17 is a view showing the relationship between the transfer mechanism and the inspection chamber in the inspection apparatus shown in FIGS. 12A and 12B.

DETAILED DESCRIPTION

Hereinafter, the present disclosure will be described based on the embodiments shown in FIGS. 1 to 18B.

Figure 2A:
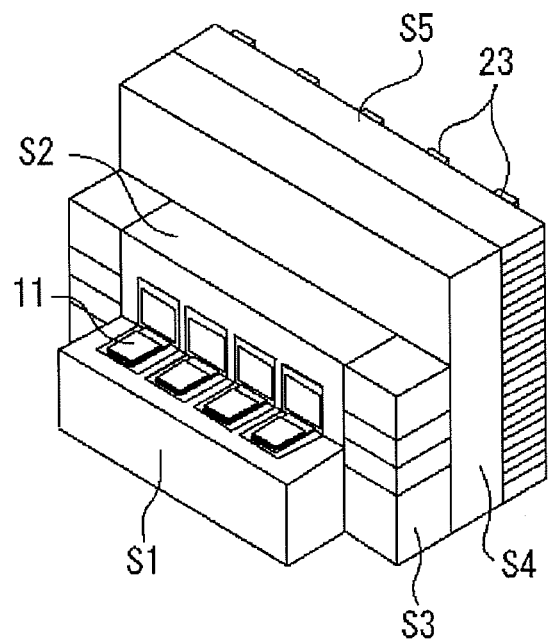
Figure 2B:
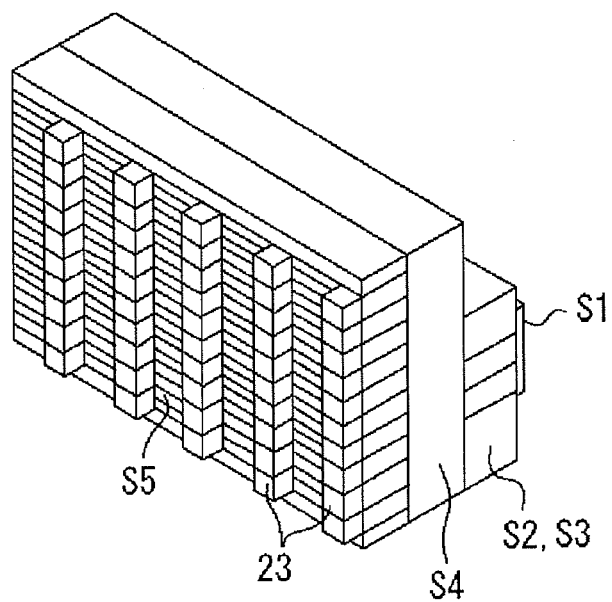

A wafer inspection apparatus 10 according to the present embodiment is, for example, illustrated in FIGS. 1, 2A and 2B. The wafer inspection apparatus 10 is divided into an loading/unloading area S1 formed to be thin and long and to load and unload a wafer by cassette in the front face of a main body of the apparatus, a first transfer area S2 formed to transfer the wafer W along the loading/unloading area S1, an alignment area S3 formed at both end portions of the first transfer area S2, a second transfer area S4 formed to transfer the wafer W along the first transfer area S2, and an inspection area S5 formed along the second transfer area S4 to inspect the wafer. As shown in FIGS. 2A and 2B, the wafer inspection apparatus 10 is received in a housing. Each of the areas S1 to S5 is formed as an independent space. A dedicated device is installed in each of the areas S1 to S5, and the dedicated devices are controlled by a control device.

As shown in FIGS. 1, 2A and 2B, loading mechanisms 11 for loading a housing F such as FOUP or the like in which a plurality of wafers W are received are installed at four positions in the loading/unloading area S1. The loading mechanisms 11 are configured to load the housing F transferred by an automatic transfer apparatus (not shown) and like and fix it in a certain position. A first wafer transfer mechanism 12 for transferring the wafers W in the housings F, each of which is loaded into each of the loading mechanisms 11, is installed at the first transfer area S2 adjacent to the loading/unloading area S1. The first wafer transfer mechanism 12 is configured to transfer the wafer W within the first transfer area S2. The first wafer transfer mechanism 12 includes an arm 12A for vacuum-adsorbing the wafer W, or rotating in a horizontal direction and simultaneously ascending/descending in a vertical direction to support a wafer retaining support as described later, a body 12B having a driving mechanism incorporated therein to rotate and lift/lower the arm 12A, and a moving mechanism (not shown) for moving the body 12B, and is configured to move within the first transfer area S2 by the moving mechanism so as to transfer the wafer W.

A pre-alignment chamber (not shown) of the wafer W, an alignment chamber 13 (See FIG. 3) of the wafer W, and a buffer chamber (not shown) are installed at the alignment areas S3 formed at both end portions of the first transfer area S2, as shown in FIGS. 1, 2A and 2B. The pre-alignment chamber, the alignment chamber 13 and the buffer chamber (not shown) are arranged vertically. A pre-alignment mechanism for performing pre-alignment of the wafer W is installed in the pre-alignment chamber. An alignment mechanism 14 (See FIG. 3) for performing alignment of the wafer W is installed in the alignment chamber 13. Further, a receiving mechanism for receiving the wafer W is installed in the buffer chamber. The buffer chamber is a temporary disposition place of the wafer W after an inspection is terminated, which may also be used as a place for receiving a needle polishing wafer.

Figure 3:
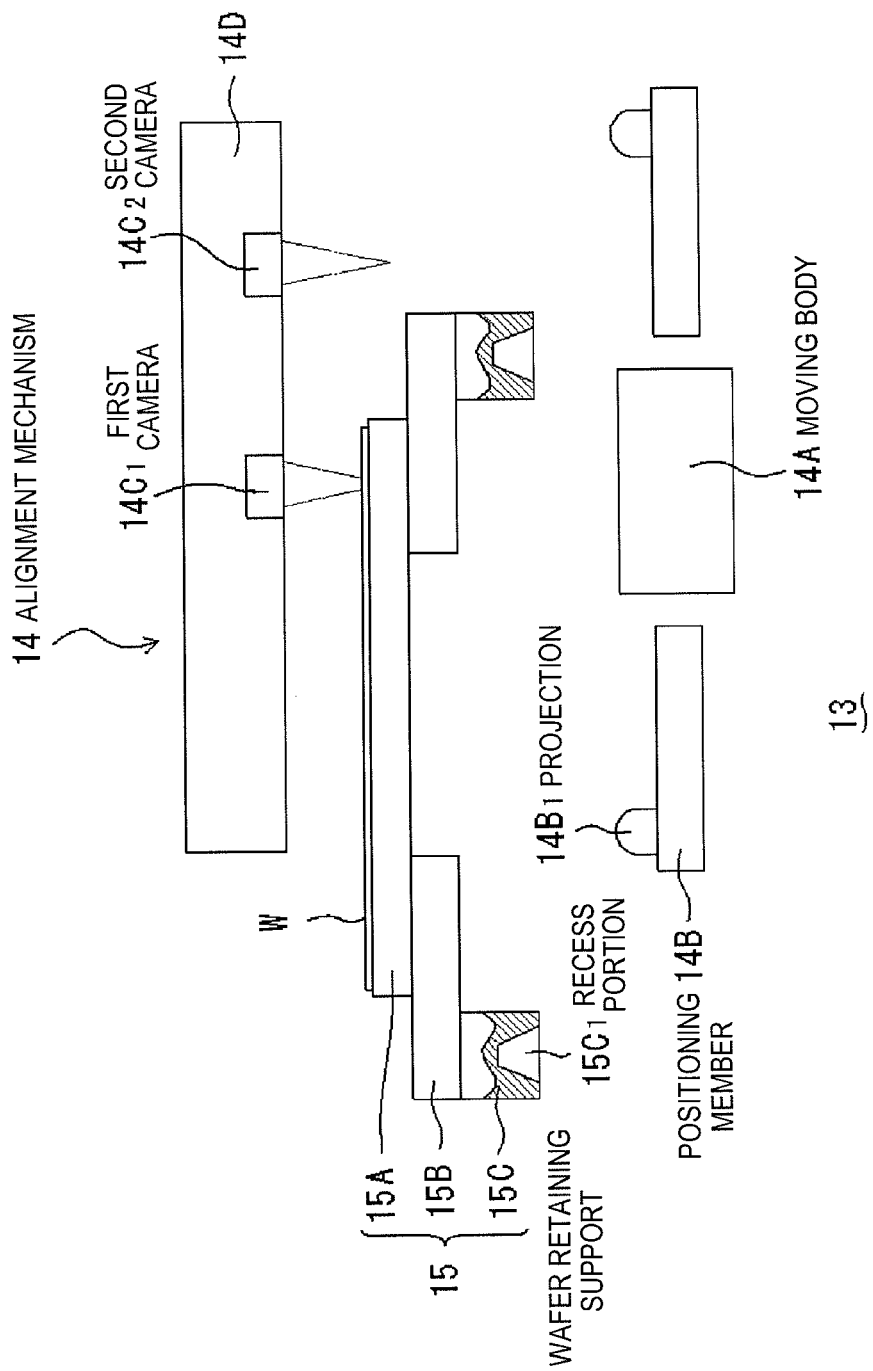
FIG. 3 is a conceptual view showing a major part of an alignment mechanism of the wafer inspection apparatus shown in FIG. 1.

As shown in FIG. 3, the alignment mechanism 14 includes a container-like moving body 14A installed on the bottom (not shown) of the alignment chamber 13 and configured to move in a vertical direction and horizontal direction, an annular positioning member 14B surrounding the moving body 14A and fixed on the bottom of the alignment chamber 13 for determining the position of the wafer retaining support 15, first and second cameras $14C_1$ and $14C_2$ for aligning the wafer W on the wafer retaining support 15 in cooperation with the moving body 14A, and a bridge 14D in which the first and second cameras $14C_1$ and $14C_2$ are fixed, and is configured to allow the first and second cameras $14C_1$ and $14C_2$ to capture an image of an upper face of the wafer W at each focal position (alignment height). The first camera $14C_1$ is disposed at position (0, 0) of XY coordinates (the origin of XY coordinates) within the alignment chamber 13 to capture an image of the center C (See FIG. 8) of the wafer W, and the second camera $14C_2$ is disposed on position (x, y) of XY coordinates to capture an image of a target mark T (See FIG. 8) of a circumferential portion of the wafer W. The first and second cameras $14C_1$ and $14C_2$ capture an image of the center C and the target mark T of the wafer W, respectively. Based on the position information of the center C and the target mark T, the control device obtains a line L (See FIG. 8) connecting the center C and the target mark T of the wafer W to obtain the slope of the line L with respect to the coordinate axis, and also corrects a position deviation of the wafer W corresponding to a plurality of pre-registered probes of a probe card from an electrode pad.

As shown in FIG. 3, the positioning member 14B is formed as a circular annular plate member having an inner diameter greater than an outer diameter of the moving body 14A, and includes a plurality of (e.g., three) projections $14B_1$ formed at certain intervals on an upper surface thereof in a perimeter direction. The plurality of projections $14B_1$ are disposed on the circumference around the central first camera $14C_1$. XY coordinate values of the plurality of projections $14B_1$ are respectively and previously set at positions of equal distance from the origin of the XY coordinates. Further, XY coordinate values of the ends of needles of the plurality of probes of the probe card to be described later are set at the XY coordinates of the alignment chamber 13.

Further, the wafer retaining support 15 includes a retaining support plate 15A for retaining and supporting the wafer W, an annular support 15B for detachably supporting the retaining support plate 15A, and a plurality of positioning units 15C having a recess portion $15C_1$ on a lower surface of the support 15B. Each of the plurality of projections $14B_1$ of the positioning member 14B is inserted into each of the recess portions $15C_1$. The wafer retaining support 15 is configured to be approximately horizontally supported and continually placed at a uniform position by the positioning member 14B. Further, as shown in FIG. 3, the support 15B has a through hole having a large diameter compared with the moving body 14A. The moving body 14A passes through the through hole. The moving body 14A can move in the XY direction within the through hole.

The moving body 14A is placed immediately below a central portion of the wafer retaining support 15 supported by the positioning member 14B. The moving body 14A ascends in a vertical direction immediately from a lower portion of the wafer retaining support 15, comes into contact with the retaining support plate 15A, and passes through the through hole of the support 15B, so as to lift the retaining support plate 15A from the support 15B up to an alignment height. Further, the moving body 14A moves in the XY directions within the range of the through hole of the support 15B at the alignment height to perform alignment of the wafer W in cooperation with the first and second cameras $14C_1$ and $14C_2$. In addition, when the moving body 14A returns to its original position after the alignment, the moving body 14A returns the retaining support plate 15A retaining and supporting the aligned wafer W onto the support 15B while maintaining the XY coordinate values at the time of alignment. The aligned wafer W is transferred to the inspection area S5 along with the wafer retaining support 15, as will be described later.

As shown in FIGS. 1, 2A and 2B, a second wafer transfer mechanism 16 is installed at the second transfer area S4 adjacent to the first transfer area S2 and the alignment area S3. The second wafer transfer mechanism 16 is configured to move within the second transfer area S4 and transfer the wafer W between the alignment area S3 and the inspection area S5 by the wafer retaining support 15. Like the first wafer transfer mechanism 12, the second wafer transfer mechanism 16 is configured to include an arm 16A, a body 16B, and a moving mechanism (not shown).

As shown in FIG. 1, a plurality of (five in the present embodiment) inspection chambers 17 are arranged in the inspection area S5 adjacent to the second transfer area S4 at certain intervals along the inspection area S5. The electrical characteristics of the alignment-completed wafer W transferred through the wafer retaining support 15 by the second wafer transfer mechanism 16 are inspected in the inspection chambers 17. Further, as shown in FIGS. 2A and 2B, the inspection chambers 17 are formed to have a stacked structure where a plurality of the inspection chambers 17 are stacked in a vertical direction in each arrangement position of the inspection area S5. The inspection chambers 17 of the respective layers have the same structure. Thus, one inspection chamber 17 will be described as an example with reference to FIG. 4 hereinafter.

Figure 4:
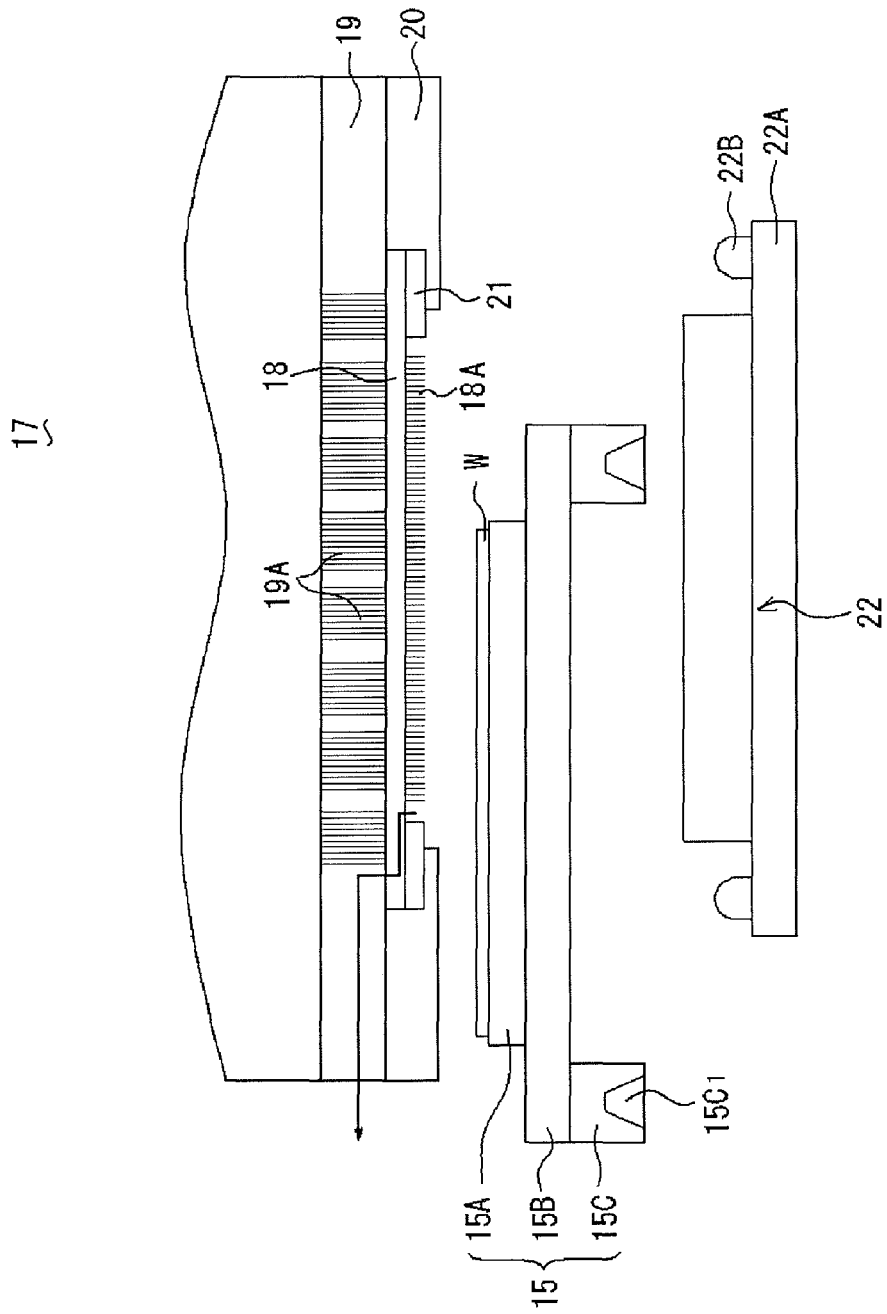
FIG. 4 is a conceptual view showing a major part of an inspection chamber of the wafer inspection apparatus shown in FIG. 1.

As shown in FIG. 4, the inspection chamber 17 includes a probe card 18 having a plurality of probes 18A corresponding to the plurality of electrode pads of the wafer W, a head plate 19 to which the probe card 18 is fixed, a wafer adsorption sealing member (hereinafter, referred to simply as a 'sealing member') 21 whose outer circumferential portion is fixed by a circular annular fixing ring 20 installed on a lower surface of the head plate 19 and formed to have a ring shape with a certain width surrounding the plurality of probes 18A, a lifting body 22 for integrally lifting or lowering the wafer retaining support 15 and incorporating a temperature regulation mechanism for cooling or heating the wafer W at a certain temperature, and an exhaustion unit (e.g., a vacuum pump)(not shown) for vacuumizing a hermetically closed space formed between the probe card 18 and the wafer W, which is elastically contacted with the outer circumferential portion of the sealing member 21 by the lifting body 22, to allow the plurality of electrode pads of the wafer W and the plurality of probes 18A to collectively contact with each other. Through-retaining support portions, which retain and support pogo pin blocks 19A for grouping a plurality of pogo pins into rectangular blocks to retain and support them, are formed on the head plate 19. The through-retaining support portions are formed at a plurality of places in a matrix form such that they correspond to the terminal electrodes on a rear surface of the probe card 18. The pogo pins of the pogo pin blocks 19A connect the probe card 18 and a tester (not shown). An exhaustion passage for exhausting air in a direction indicated by the arrow in FIG. 4 is formed on the outer circumferential portions of the head plate 19 and probe card 18. An outlet of the exhaustion passage is connected to the vacuum pump through a pipe. An exhaustion mechanism including the exhaustion unit and the exhaustion passage will be described later.

As shown in FIG. 4, a flange portion 22A is formed on a lower surface of the lifting body 22. A plurality of projections 22B, which fit to the recess portion $15C_1$ of the positioning member 15C of the wafer retaining support 15, are formed at certain intervals in a perimeter direction on an upper face of the flange portion 22A. The projections 22B are disposed at positions of the same XY coordinates corresponding to the plurality of projections $14B_1$ formed on the positioning member 14B within the alignment chamber 13. Namely, since the XY coordinates in the inspection chamber 17 and the XY coordinates in the alignment chamber 13 are in the same coordinate position relationship, the position coordinates in the horizontal directions (X, Y, and θ directions) of the wafer W, which was aligned in the alignment chamber 13, on the retaining support plate 15A reappear in the inspection chamber 17. Accordingly, the plurality of electrode pads are aligned to be reliably in contact with the plurality of probes 18A of the probe card 18. Further, the flange portion 22A and the plurality of projections 22B of the lifting body 22 correspond to the positioning member 14B within the alignment chamber 13.

The lifting body 22 lifts the wafer retaining support 15 supported by the plurality of projections 22B of the flange portion 22A upwardly toward the probe card 18 to allow the outer circumferential portion of the aligned wafer W to be elastically brought into contact with the sealing member 21 to form a hermetically closed space. The hermetically closed space is decompressed through the exhaustion mechanism to allow the wafer W to be vacuum-adsorbed to the sealing member 21. Further, the lifting body 22 is driven to leave the vacuum-adsorbed wafer W at the probe card 18 side, to lower and separate the wafer retaining support 15 from the wafer W, to unload the wafer retaining support 15 by the second wafer transfer mechanism 16 from the inspection chamber 17, to ascend again to allow the wafer W and the plurality of probes to be in pressure-contact, and then to inspect electrical characteristics of the wafer W at a certain temperature. After the inspection, the inspection-completed wafer W returns back through the reverse steps so as to be unloaded from the inspection chamber 17.

The space of the inspection chamber 17 according to the present embodiment may be sufficient if the space of the inspection chamber 17 includes the space in which the wafer retaining support 15 is loaded and unloaded and the space in which the lifting body 22 is lifted or lowered to allow the wafer W retained and supported by the wafer retaining support 15 to be brought into contact with the probe card 18. Accordingly, the height of the inspection chamber 17 can be remarkably lowered compared with the conventional art. Further, as described above, the installation space of the inspection chamber can be significantly reduced by employing the stacked structure. Moreover, since the lifting body 22 is not required to move in the XY direction, the occupancy area of the inspection chamber 17 can also be significantly reduced. In addition, since the alignment mechanism 14 can be shared by the respective inspection chambers 17, there is no need to install the high-priced alignment mechanism 14 in each of the inspection chambers 17, as in the conventional art, and the cost can be considerably reduced.

Further, as shown in FIGS. 1, 2A, and 2B, a cooling duct 23 is installed in each of the inspection chambers 17 in order to cool the wafer W heated during the inspection through each cooling device (not shown) to constantly maintain a uniform temperature.

Figure 5:
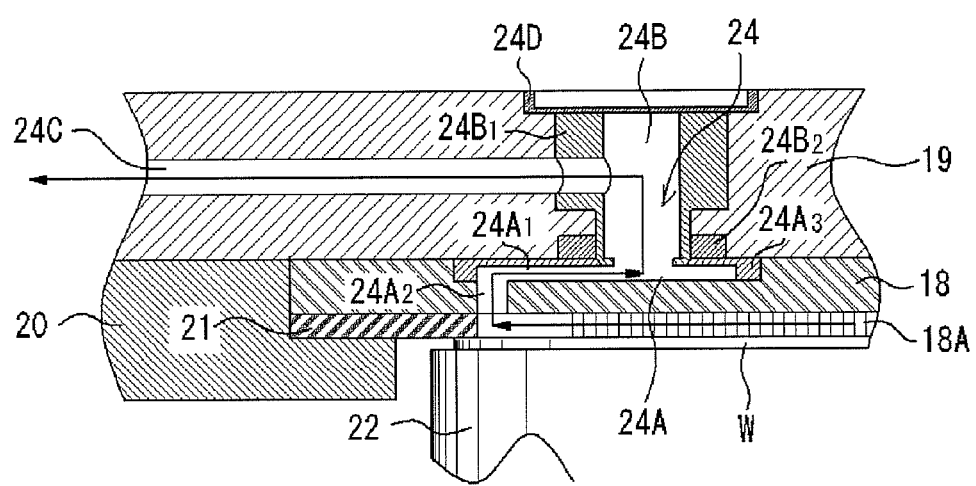
FIG. 5 is a sectional view specifically showing an exhaustion mechanism of the inspection chamber shown in FIG. 4.

Now, the exhaustion mechanism 24 for vacuum-adsorbing the wafer W to the sealing member 21 while the electrical characteristics of the wafer W are inspected will be described by way of example with reference to FIG. 5. As shown in FIG. 5, the exhaustion mechanism 24 includes a first exhaustion passage 24A formed at one place of the outer circumferential portion of the probe card 18, a second exhaustion passage 24B formed in a vertical direction in the head plate 19 such that it communicates with the first exhaustion passage 24A, a third exhaustion passage 24C extending from one position of a surrounding face of the second exhaustion passage 24B in a diameter direction within the head plate 19 and opened at an outer circumferential surface of the head plate 19, and a vacuum pump (not shown) connected to the third exhaustion passage 24C through a pipe (not shown).

As shown in FIG. 5, the first exhaustion passage 24A includes a shallow concave recess portion $24A_1$ formed on an upper face of the outer circumferential portion of the probe card 18, a hole $24A_2$ formed to penetrate a lower portion of the concave recess portion $24A_1$, and a metal member $24A_3$ having a hole for blocking an upper opening of the concave recess portion $24A_1$. Further, the second exhaustion passage 24B includes a bolt $24B_1$ mounted in a through hole formed in a vertical direction in the head plate 19 and having a hollow exhaustion passage, and a nut $24B_2$ for fixing the hollow bolt $24B_1$ to the head plate 19. The second exhaustion passage 24B is mounted in the head plate 19 such that an axial core of the exhaustion passage of the hollow bolt $24B_1$ and that of the hole of the metal member $24A_3$ are consistent. A cover member 24D for hermetically sealing the second exhaustion passage 24B is mounted at an upper end portion of the hollow bolt $24B_1$. Moreover, a hole for communicating the exhaustion passage and the second exhaustion passage 24C is formed on a surrounding face of the hollow bolt $24B_1$.

Additionally, as shown in FIG. 5, the sealing member 21 is formed to have approximately the same thickness as the length of the probe 18A. Accordingly, the sealing member 21 is brought into contact with the wafer W lifted by the lifting body 22, whereby a small gap is formed between the upper face of the wafer W and the probe 18A. When the vacuum pump is driven in a state that the wafer W is in contact with the sealing member 21 as such, the hermetically closed space formed between the wafer W and the probe card 18 is decompressed and the wafer W is adsorbed to the sealing member 21 so as to be elastically in contact therewith. Thus, the plurality of electrode pads of the wafer W and the plurality of probes 18A are slightly in contact. As described above, although the lifting body 22 descends, the wafer W can be maintained in a state of being adsorbed to the sealing member 21.

Next, the operation will be described with reference to FIGS. 6A to 11B.

First, the housing F such as FOUP or the like is loaded on each loading mechanism 11 of the loading/unloading area S1 by an automatic transfer device. The first wafer transfer mechanism 12 is driven at the first transfer area S2 to unload the wafers W individually from the housing F through the arm 12A and transfer the wafers W to the pre-alignment mechanism within the pre-alignment chamber of the alignment area S3. Then, the wafer W is pre-aligned therein. Thereafter, the first wafer transfer mechanism 12 unloads the wafer W from the pre-alignment chamber through the arm 12A and transfers the wafer W along with the wafer retaining support 15 to the alignment chamber 13 through the arm 12A.

Figure 6A:
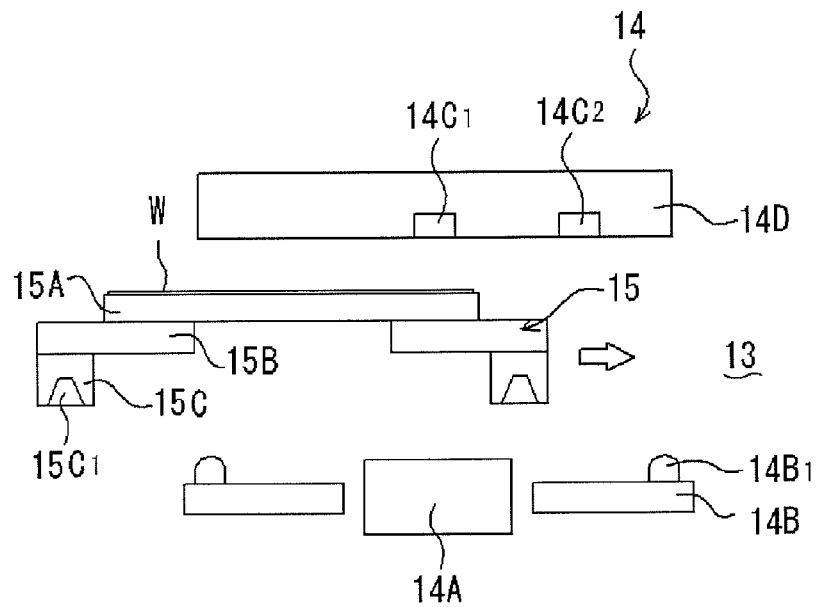
FIGS. 6A and 6B are views showing an aligning process using the alignment mechanism shown in FIG. 3.
Figure 6B:
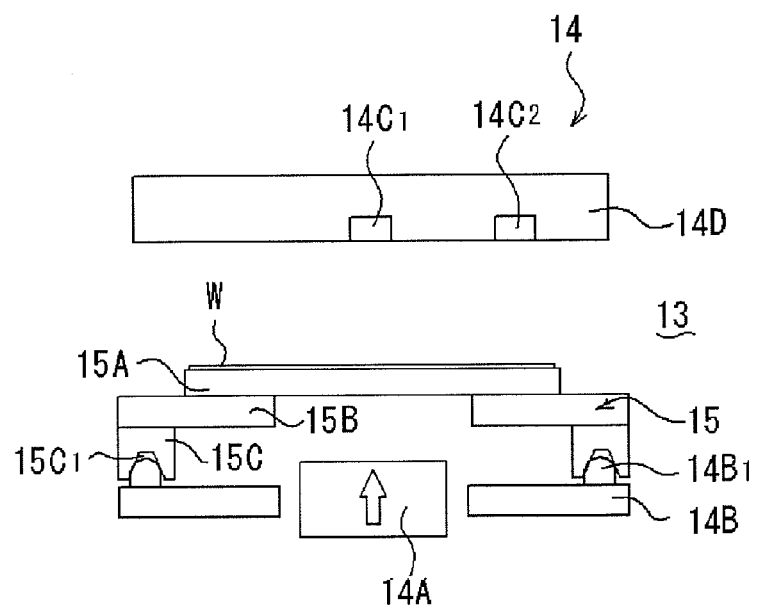
Figure 7A:
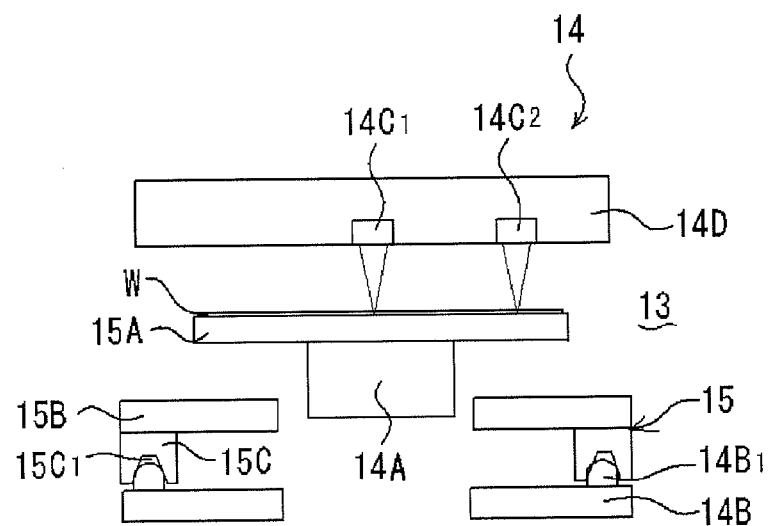
FIGS. 7A and 7B are views showing the aligning process using the alignment mechanism shown in FIG. 3, which follows the process shown in FIGS. 6A and 6B.
Figure 7B:
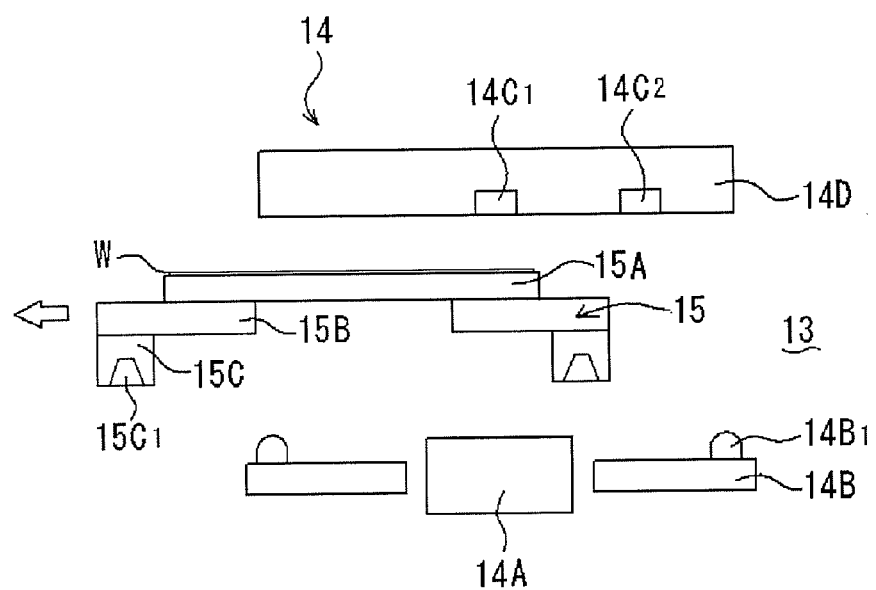

Next, as shown in FIG. 6A, the first wafer transfer mechanism 12 transfers the wafer W into the alignment chamber 13 through the wafer retaining support 15. As shown in FIG. 6B, the first wafer transfer mechanism 12 delivers the wafer retaining support 15 to the positioning member 14B. At this time, the recess portion $15C_1$ of the positioning unit 15C of the wafer retaining support 15 is fit to the projection $14B_1$ of the positioning member 14B, whereby the position of the wafer retaining support 15 is automatically determined in the alignment chamber 13. After the position is determined, the moving body 14A ascends, as indicated by the arrow in FIG. 6B.

Figure 8:
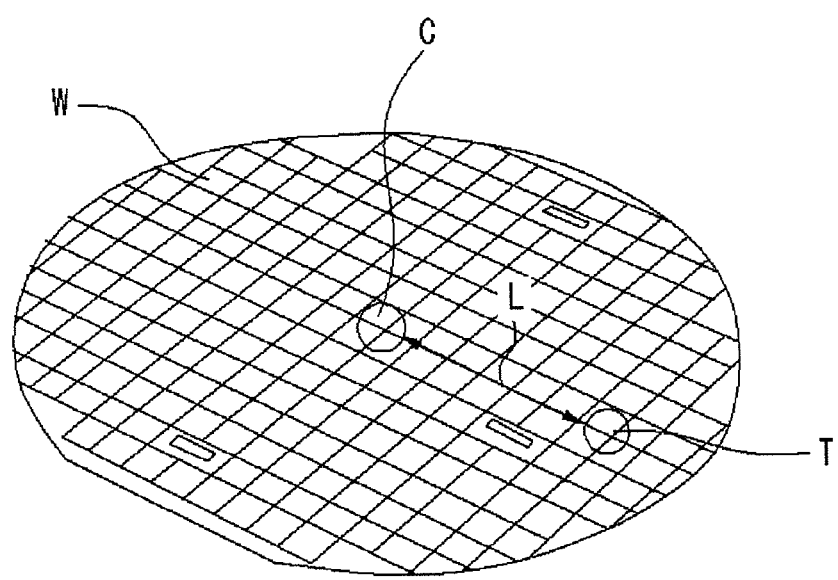
FIG. 8 is a perspective view of a wafer in the aligning process using the alignment mechanism shown in FIG. 3.

The moving body 14A ascends to come into contact with the retaining support plate 15A, and as shown in 7A, the moving body 14A ascends up to the alignment height and is stopped. At this position, the first and second cameras $14C_1$ and $14C_2$ and the moving body 14A are operated under the control of the control device. Namely, as shown in FIG. 8, the first camera $14C_1$ captures an image of the wafer W to recognize the center C of the wafer W. When the first camera $14C_1$ cannot recognize the center C of the wafer W, while the moving body 14A moves in the XY direction within the range of the through hole of the support 15B of the wafer retaining support 15, the first camera $14C_1$ finds the center C of the wafer W on the retaining support plate 15A to recognize the center C. Subsequently, the second camera $14C_2$ captures an image of the target T of the circumferential portion of the wafer W to recognize the slope in the θ direction of the wafer W from the line L connecting the center C and the target T, and the coordinate axis. When the second camera $14C_2$ recognizes the slope of the wafer W, the moving body 14A rotates in the θ direction to correct the slope deviation of the wafer W with respect to the XY coordinates. Subsequently, the first camera $14C_1$ again checks the center of the wafer W to recognize the center C thereof. Through such sequential operations to recognize the center C, the alignment of the wafer W is terminated.

After the alignment, the moving body 14A descends to its original position, and midway, the retaining support plate 15A is loaded on the support 15B. Thereafter, the second wafer transfer mechanism 16 is driven at the second transfer area S4 to transfer the wafer W along with the wafer retaining support 15 from the alignment chamber 13 to the certain inspection chamber 17 of the inspection area S5 as indicated by the arrow in FIG. 7B.

Figure 9A:
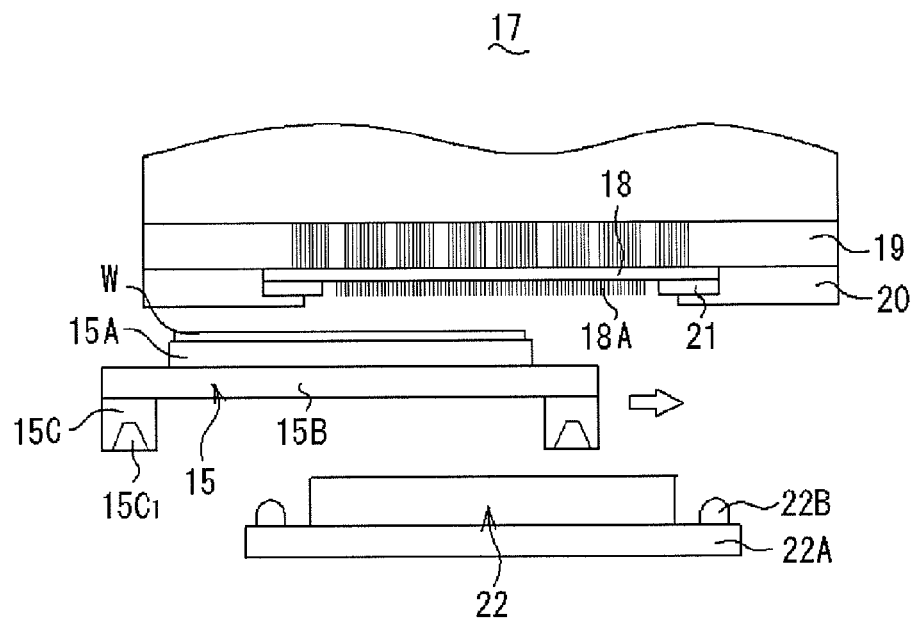
FIGS. 9A and 9B are views showing an inspecting process in the inspection chamber shown in FIG. 4.
Figure 9B:
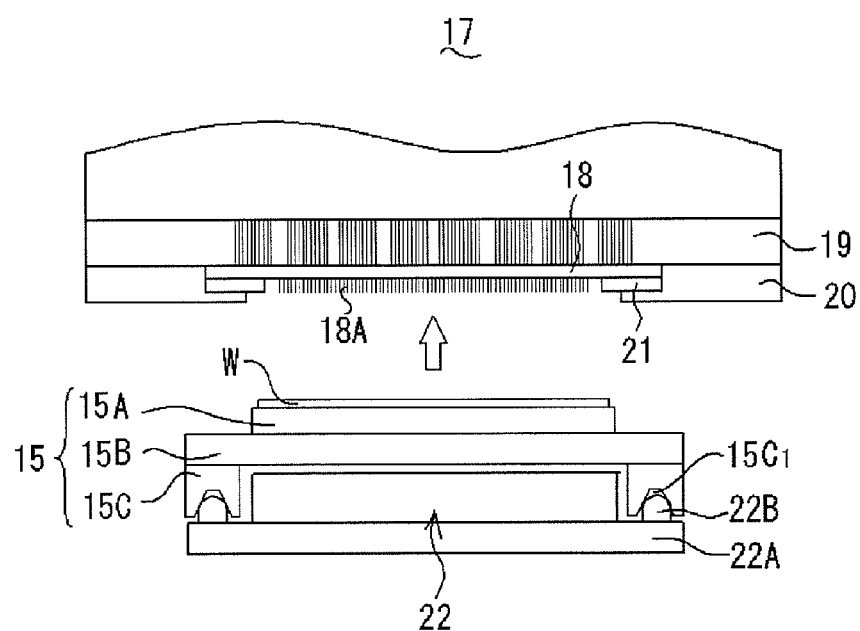

As shown in FIG. 9A, the second wafer transfer mechanism 16 transfers the wafer retaining support 15 into a certain inspection chamber 17 at the inspection area S5, and as shown in FIG. 9B, the second wafer transfer mechanism 16 delivers the wafer retaining support 15 to the lifting body 22. At this time, the plurality of recess portions $15C_1$ of the positioning unit 15C of the wafer retaining support 15 are fit to the plurality of projections 22B of the lifting body 22, whereby the position of the wafer retaining support 15 is automatically determined in the inspection chamber 17 to maintain the alignment state in the alignment chamber 13. As indicated by the arrow in FIG. 9B, the lifting body 22 with the wafer retaining support 15 supported thereon ascends in a vertical direction until the wafer is elastically brought into contact with the sealing member 21 from the alignment position.

Figure 10A:
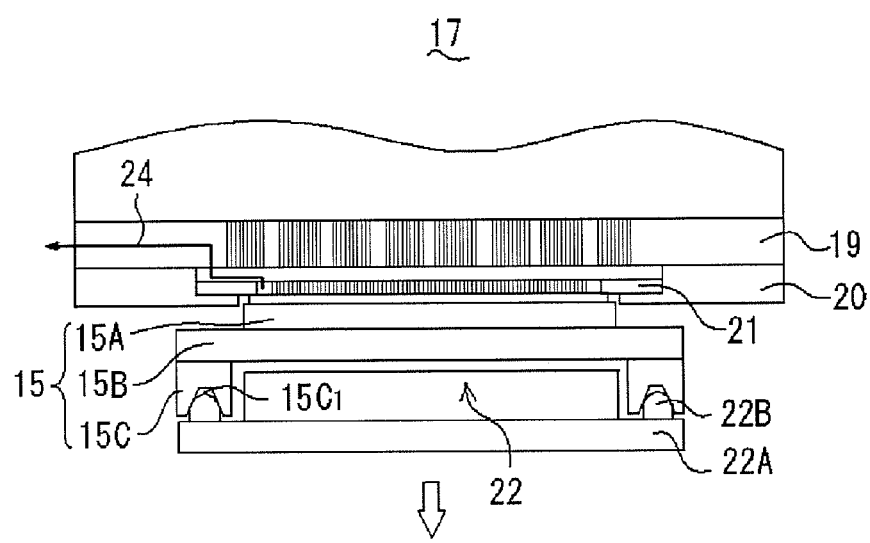
FIGS. 10A and 10B are views showing the inspecting process in the inspection chamber shown in FIG. 4, which follows the process shown in FIGS. 9A and 9B.
Figure 10B:
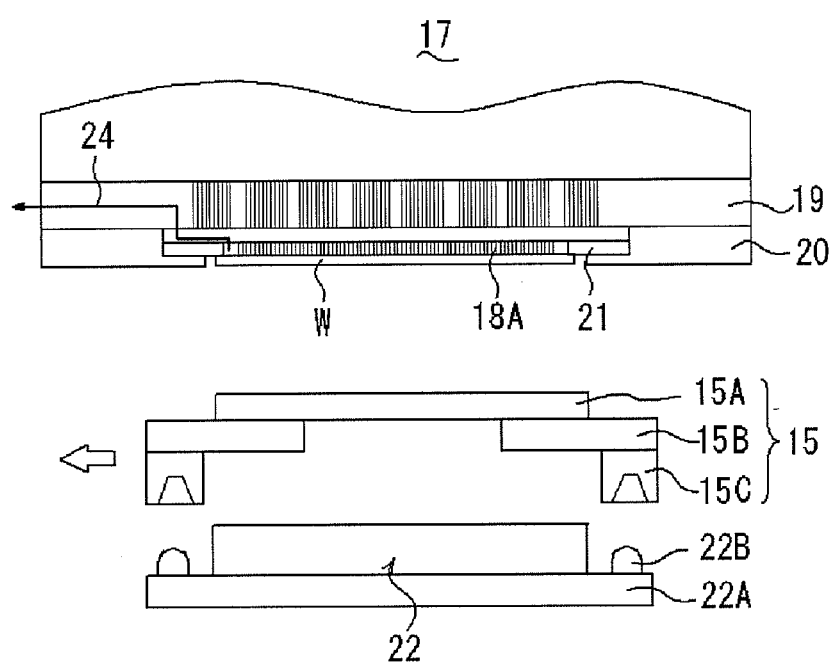

When the lifting body 22 ascends, as shown in FIG. 10A, the circumferential portion of the wafer W comes into contact with the sealing member 21, and a hermetically closed space is formed by the wafer W, the sealing member 21, and the probe card 18. Here, the vacuum pump of the exhaustion mechanism 24 is operated to exhaust air within the hermetically closed space from the first, second and third exhaustion passages 24A, 24B, 24C (See FIG. 5) as indicated by the arrow in FIG. 10A, to vacuum-adsorb the wafer W to the sealing member 21. When the wafer W is vacuum-adsorbed to the sealing member 21, the lifting body 22 with the wafer retaining support 15 supported thereon descends to the original position as indicated by the white arrow in FIG. 10A. In the interim, the second wafer transfer mechanism 16 separates the wafer retaining support 15 from the lifting body 22 and returns the wafer retaining support 15 to the buffer chamber of the alignment area S3 from the inspection chamber 17 as indicated by the white arrow in FIG. 10B. The wafer retaining support 15 is ready for inspecting a next wafer W.

Figure 11A:
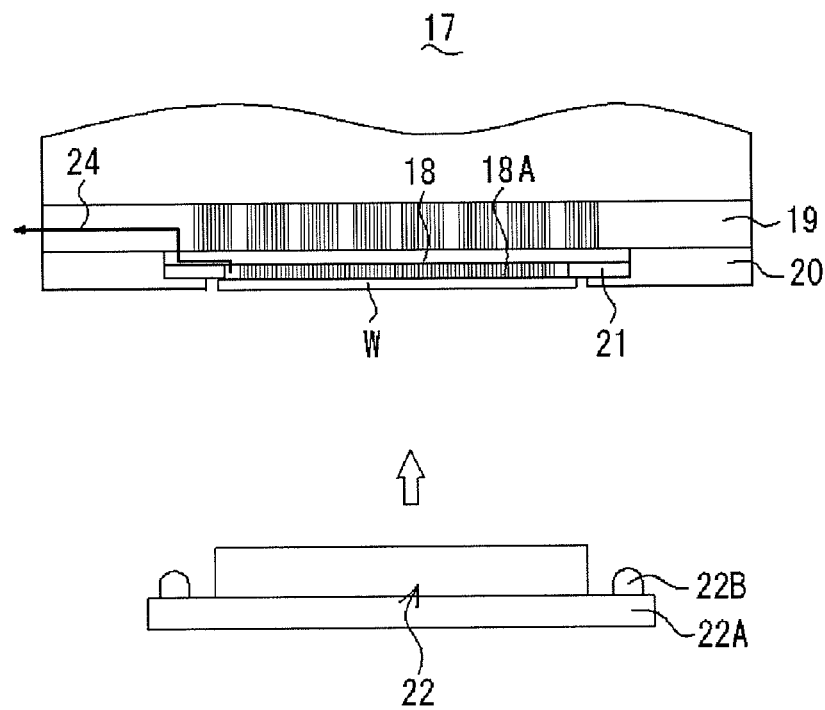
FIGS. 11A and 11B are views showing the inspecting process in the inspection chamber shown in FIG. 4, which follows the process shown in FIGS. 10A and 10B.
Figure 11B:
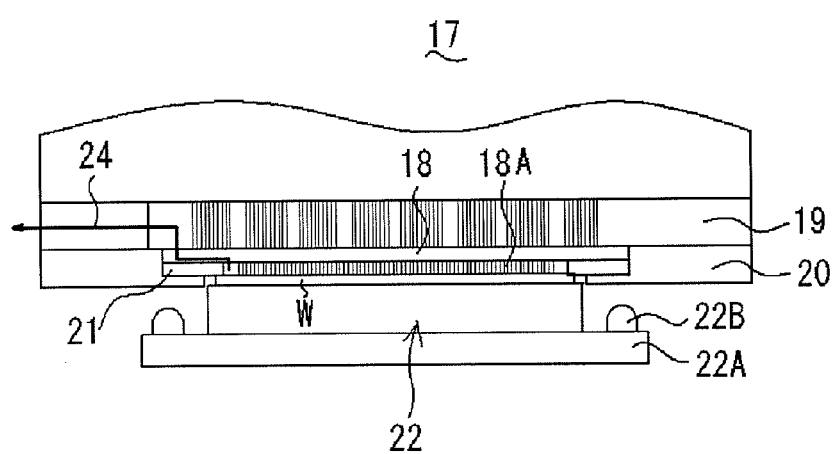

When the wafer retaining support 15 is unloaded from the inspection chamber 17, the lifting body 22 ascends again in the vertical direction as indicated by the white arrow in FIG. 11A. As shown in FIG. 11B, the lifting body 22 presses the wafer W vacuum-adsorbed to the probe card 18 to allow the plurality of electrode pads of the wafer W and the plurality of probes 18A of the probe card 18 to be collectively brought into contact electrically. In the state that the wafer W and the probe card 18 are in electrical contact, the electrical characteristics of the wafer W are inspected.

When a high temperature inspection is performed on the wafer W, the wafer W is heated up to a certain temperature (e.g., 150° C.) through the lifting body 22 by using the temperature regulation mechanism of the lifting body 22. There is a temperature difference between the heated wafer W and the probe card 18. Accordingly, when the heated wafer W is brought into contact with the probe card 18, although the electrode pads of the wafer W and the probe 18A have been aligned, a position deviation occurs between the electrode pad and the probe 18. This makes it difficult to secure a reliable inspection.

Thus, in the present embodiment, as shown in FIGS. 5 and 11B, the wafer retaining support 15 is unloaded from the inspection chamber 17, and then the lifting body 22 is brought into contact with the wafer W vacuum-adsorbed to the sealing member 21. In this state, the wafer W is heated (pre-heated). At this time, the wafer W is elastically in contact with the sealing member 21 and, at the same time, is in contact with all the probes 18A of the probe card 18. Accordingly, when the wafer W is heated, the probe card 18 can be heated up to a certain temperature within a short time by the direct heat transmission from the wafer W to the probe card 18 through the probes 18A in contact with the wafer W and by the radiant heat from the wafer W. Moreover, the wafer W and the probes 18A are thermally expanded while being maintained in the contact state at the alignment operation, whereby they can be pre-heated to approximately the same inspection temperature without a position deviation. Immediately after the pre-heated state, the high temperature inspection can be continuously performed on the wafer W. This assures the reliability of inspection.

When the inspection is terminated, the lifting body 22 descends and returns to its original position. In the interim, the second wafer transfer mechanism 16 loads the wafer retaining support 15 into the inspection chamber 17 and delivers the wafer retaining support 15 to the lifting body 22. Next, the second wafer transfer mechanism 16 is removed from the inspection chamber 17. Meanwhile, the lifting body 22 ascends along with the wafer retaining support 15 to allow the retaining support plate 15A to be brought into contact with the inspection-completed wafer W. At this time, the vacuum adsorption by the vacuum pump of the air exhaustion mechanism 24 is stopped and the hermetically closed space returns to a normal pressure. Then, while the lifting body 22 returns to its original position, the second wafer transfer mechanism 16 receives the wafer retaining support 15 from the lifting body 22, leaves the inspection chamber 17, and returns the wafer retaining support 15 to the buffer chamber. Subsequently, the first wafer transfer mechanism 12 is driven to return the wafer W from the wafer retaining support 15 to the interior of the housing F of the loading mechanism 11. Through such sequential operations, the inspection of the wafer W is terminated. Other wafers are transferred to the plurality of inspection chambers 17 at the inspection area S5 from the housing F and similarly inspected.

As described above, according to the present embodiment, the housing F is loaded at the loading/unloading area S1. The wafer W aligned by the alignment mechanism 14 of the alignment area S3 is transferred to the inspection chamber 17 installed at the inspection area S5 through the wafer retaining support 15 by using the first and second wafer transfer mechanism 12 and 16 installed at the first and second transfer areas S2 and S4, respectively. Accordingly, the electrical characteristics of the wafer W can be inspected, without alignment of the wafer W retained and supported by the wafer retaining support 15 in the inspection chamber 17. Thus, the installation space of the wafer inspection apparatus 10 can be drastically reduced, and also, the installation cost can be remarkably reduced.

Further, where the high temperature inspection is performed on the wafer W, after the wafer W and the probe card 18 are aligned, they are vacuum-adsorbed. In this state, in order to pre-heat the wafer W to a certain temperature by the lifting body 22 in contact with the wafer W, the wafer W and the probe card 18 can be maintained in the aligned state. Thus, the wafer W and the probe card 18 are not required to be aligned again after the pre-heating and the high temperature inspection can be performed without a position deviation between the electrode pads of the wafer W and the probes 18A. This assures the reliability of the high temperature inspection.

In addition, according to the present embodiment, since the electrical characteristics of the wafer W can be inspected by simply lifting the wafer W in the inspection chamber 17, the space of the inspection chamber 17 can be saved. Further, since the inspection chambers 17 having the multi-layered structure can be provided at a plurality of locations in the inspection area S5, inspection efficiency can be significantly enhanced.

A second embodiment According to a wafer inspection apparatus in the present embodiment, less space is required and a wafer transfer mechanism is simplified by reducing a first loading/unloading area S1 of the wafer inspection apparatus in the first embodiment, as shown in FIGS. 12A to 18B. Thus, characteristic features of the present embodiment will be mainly described hereinafter.

Figure 12A:
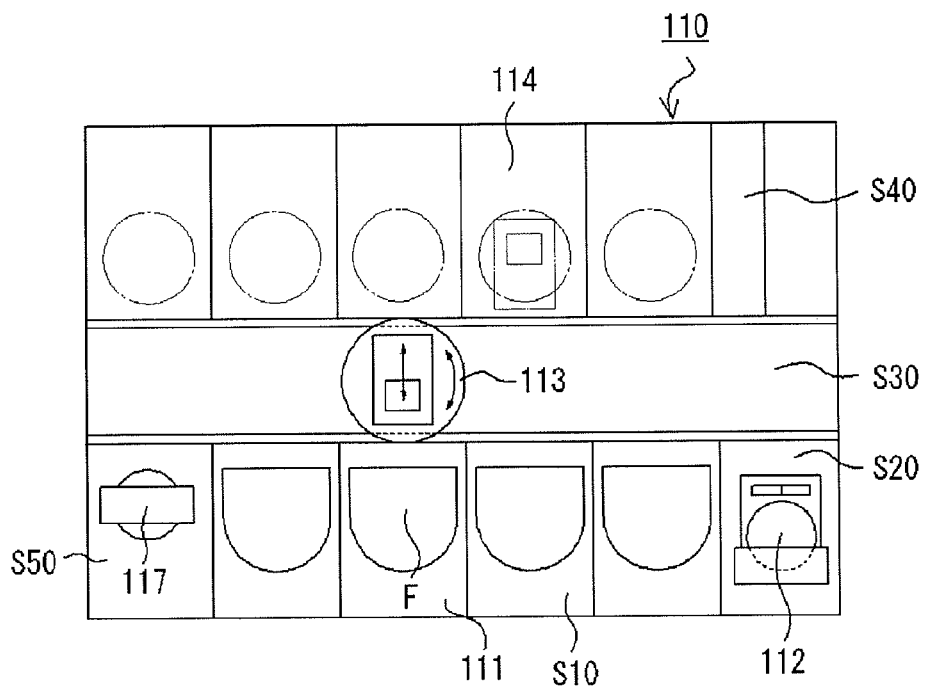

That is, as shown in FIG. 12A, the wafer inspection device 110 of the present embodiment, for example, is divided into a loading/unloading area S10 formed on the front side of the apparatus body in a long and narrow shape where wafers W are loaded/unloaded as a cassette, a alignment area S20 formed on the right end of the loading/unloading area S10, a transfer area S30 formed so as to transfer wafers W along the loading/unloading area S10 and the alignment area S20, and wafer inspection area S40 formed along the transfer area S20. Those areas are configured such that each of the areas S10 to S40 is formed as an independent space, as in the first embodiment.

Figure 12B:
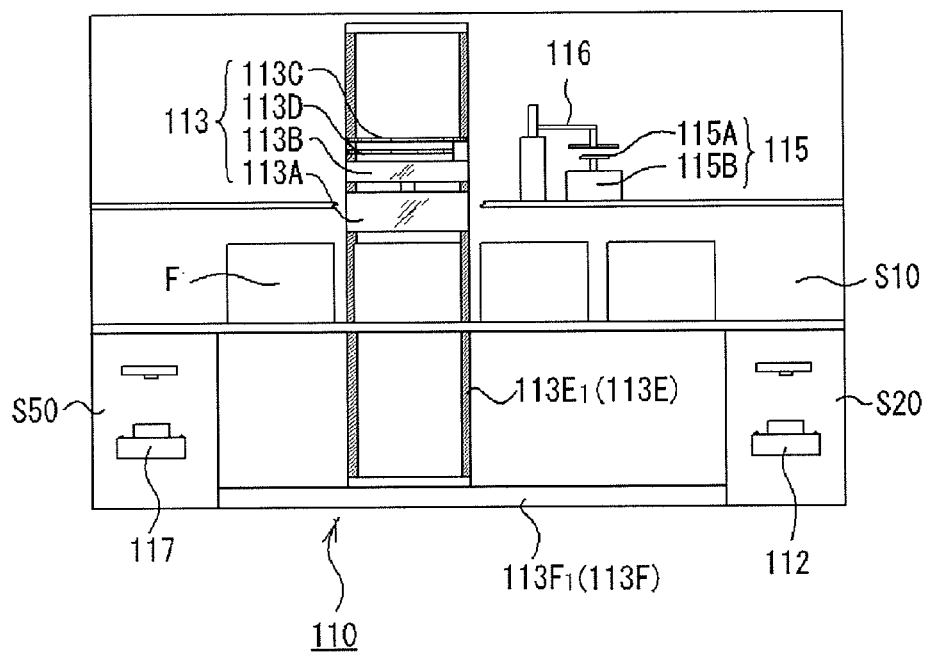
Figure 13:
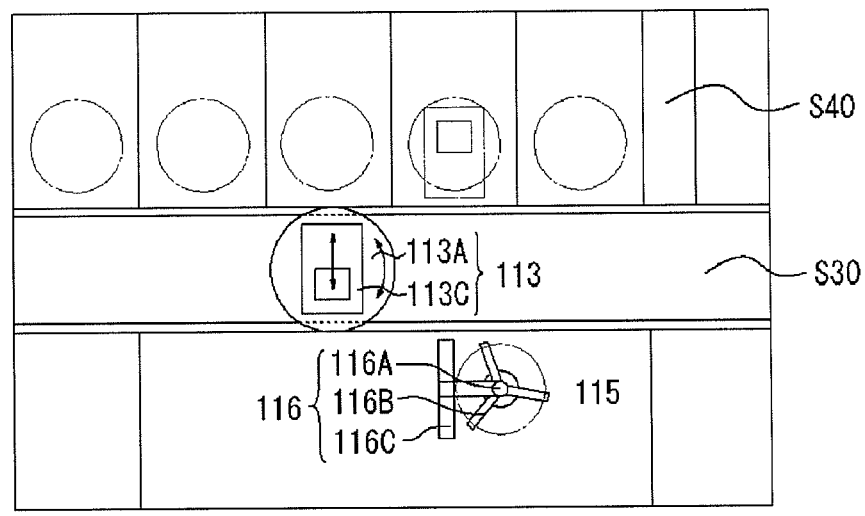
FIG. 13 is a plan view showing a wafer moving mechanism disposed on the loading mechanism of the inspection apparatus shown in FIGS. 12A and 12B.

As shown in FIGS. 12A and 12B, a loading mechanism 111, an alignment chamber 112, a wafer transfer mechanism 113 and an inspection chamber 114 are installed in the loading/unloading area S10, the alignment area S20, the transfer area S30 and the inspection area S40, respectively. Further, as shown in FIGS. 12B and 13, a wafer pre-alignment mechanism 115 and a wafer moving mechanism 116 are installed on the upper end of the loading mechanism 111. Accordingly, the wafer transfer mechanism 113 transfers un-inspected wafers W from a housing F to the pre-alignment mechanism 115 and the wafers W are pre-aligned in the pre-alignment mechanism 115. The wafer moving mechanism 116 moves the wafers W from the pre-alignment mechanism 115 to the wafer transfer mechanism 113 after the pre-alignment. The wafer transfer mechanism 113 transfers the wafers W to the alignment chamber 112 and transfer the wafers W to the inspection chamber 114 after the alignment. Further, the wafer transfer mechanism 113 transfers the inspected wafers W from the inspection chamber 114 to the original position of the housing F of the loading mechanism 111 through a probe mark inspection apparatus 117 installed in a probe mark inspection area S50 on the left end of the loading mechanism 111.

As shown in FIG. 12B, the wafer transfer mechanism 113 is provided with a base 113A, a rotation body 113B being rotatable in a forward and reverse direction by a rotation shaft on the base 113A, two upper and lower arms 113C and 113D separately moving back and forth in one direction on the rotation body 113B, a lifting mechanism 113E lifting the base 113A and the arms 113C, 113D, a transporting mechanism 113F transporting back and forth those mechanisms along the transfer area S30. The lifting mechanism 113E is configured to move the base 113A and the arms 113C, 113D upwardly and downwardly by a ball screw $113E_1$. The transporting mechanism 113E is configured to move the base 113A back and forth and the arms 113C, 113D transversely along a rail $113F_1$ by the ball screw (not shown). Relation of the wafer transfer mechanism 113, the pre-alignment mechanism 115 and the wafer moving mechanism will be described hereinafter.

As shown in FIG. 12B, the pre-alignment mechanism 115 is provided with a sub-chuck 115A being rotatable in a forward and reverse direction and attaching the un-inspected wafers W transferred by the lower arm 113D of the wafer transfer mechanism 113 by vacuum, the base 115B having a driving mechanism to rotate the sub-chuck 115A in a forward and reverse direction therein and a sensor (not shown) to sense marks such as an orientation or a notch of the wafers W rotated by the sub-chuck 115A. Further, the pre-alignment mechanism 115 is configured to detect the mark of the wafers W when the wafer W is rotated by the sub-chuck 115A and stop the sub-chuck 115A so that the wafer W is arranged in a predetermined direction.

Figure 15A:
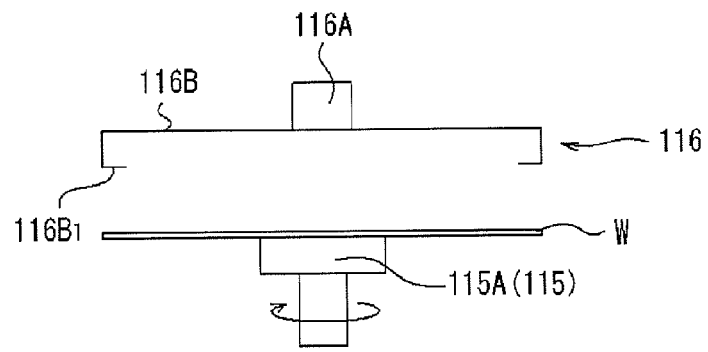
FIGS. 15A to 15C are views showing the wafer pre-alignment process in the inspection apparatus shown in FIGS. 12A and 12B, respectively.
Figure 15B:
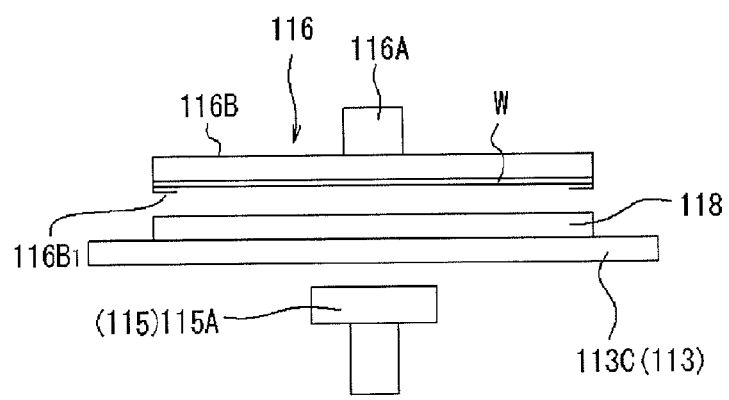
Figure 15C:
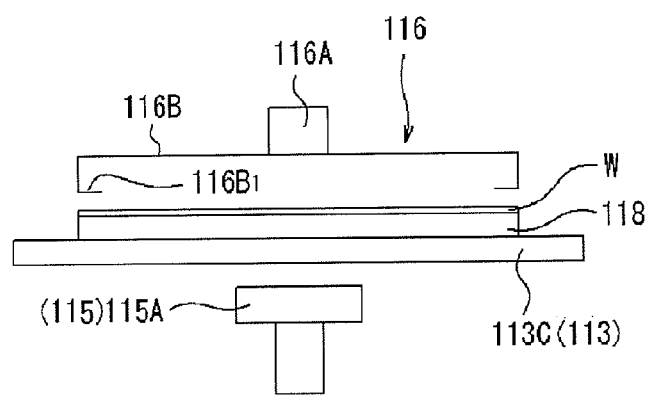

Moreover, the moving mechanism 116 comprises three gripping rods 116B which are radially mounted at a 120 degree angle from each other around a supporting rod 116A in order to grip the wafer W, a lifting mechanism 116C which lifts the three gripping rods 116B by the supporting rod 116A, as shown in the FIGS. 12B, 13, 15B and 15C. The gripping rods 116B extend, and then grip the pre-aligned wafer W, and lift down. Thus, as shown in FIGS. 15B and 15C, the moving mechanism 116 is configured to move the wafer W to an upper arm 113C of the wafer transfer mechanism 113. The side of the front end of the gripping rod 116B is separated into a reverse "C" shape, thereby forming a supporting member $116B_1$, and supporting the outer periphery of the wafer W by a supporting member $116A_1$, as shown in the FIG. 13. The supporting member $116B_1$ is adapted for vacuum-absorbing the outer periphery of the wafer W and supporting it. The moving mechanism 116 can absorb the wafer W by the supporting members $116B_1$ of the front ends of the three gripping rods 116B. Thus the moving mechanism 116 can grip the wafer horizontally and lift it at the same time.

Figure 14:
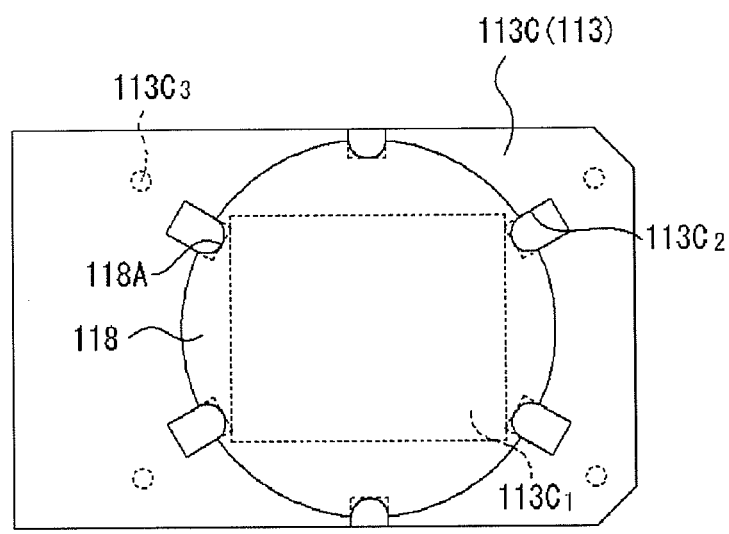
FIG. 14 is a plan view showing a wafer retaining support plate and an upper arm of the transfer mechanism used in the inspection apparatus shown in FIGS. 12A and 12B.

The upper arm 113C of the wafer transfer mechanism 113 which receives the pre-aligned wafer W from the moving mechanism 116, absorbs and retains the pre-aligned wafer W by a wafer retaining plate 118, and transfers the wafer W to an alignment area and an inspection area, as shown in the FIG. 14. A big circular hole $113C_1$ is formed from the center to the front end in the upper arm 113. Also, a lower arm 113D transfers an uninspected wafer W from the housing F to the pre-alignment mechanism 115.

The wafer retaining plate 118, as shown in the FIG. 14, is manufactured to have a substantially identical diameter with the wafer W. Cutout portions 118A are formed on six parts of the outer periphery of the wafer retaining plate 118, and are separated in a radially equal space to each other. Three parts of cutout portions 118A are formed so that the supporting members $116B_1$ of the three gripping rods 116B gripping the wafer can be passed through. Also, a small hole $16C_2$ is formed on the upper arm 16C, which corresponds to the cutout portion 118A of the wafer retaining plate 118. Thus, the moving mechanism 116 grips the pre-aligned wafer W by the supporting members $116B_1$ of the three gripping rods 116B. When moving the wafer W from a sub-chuck 115A of the pre-alignment mechanism 115 to the wafer retaining plate 118, the supporting members $116B_1$ of the three gripping rods 116B can pass through the cutout portion 118A of the wafer retaining plate 118 and the hole $16C_2$.

Figure 16A:
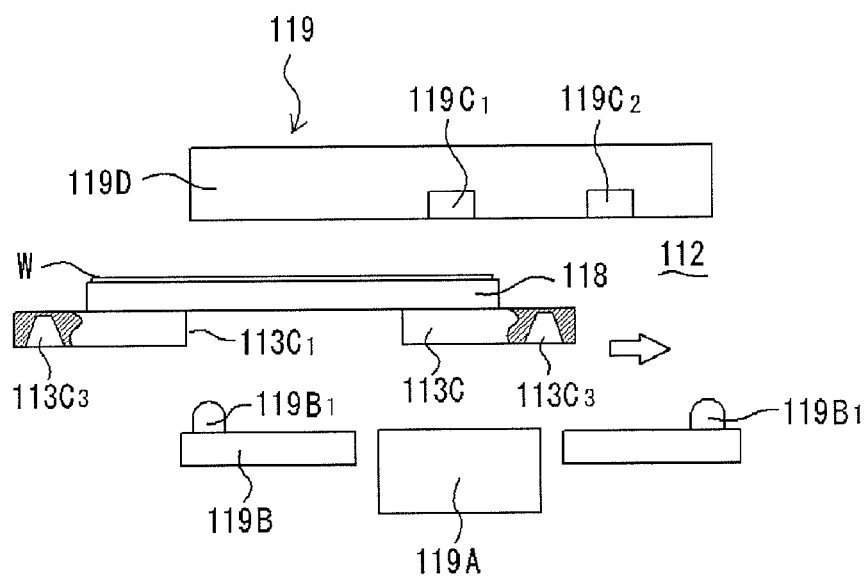
FIGS. 16A and 16B are views showing the alignment process in the alignment chamber shown in FIGS. 12A and 12B, respectively.
Figure 16B:
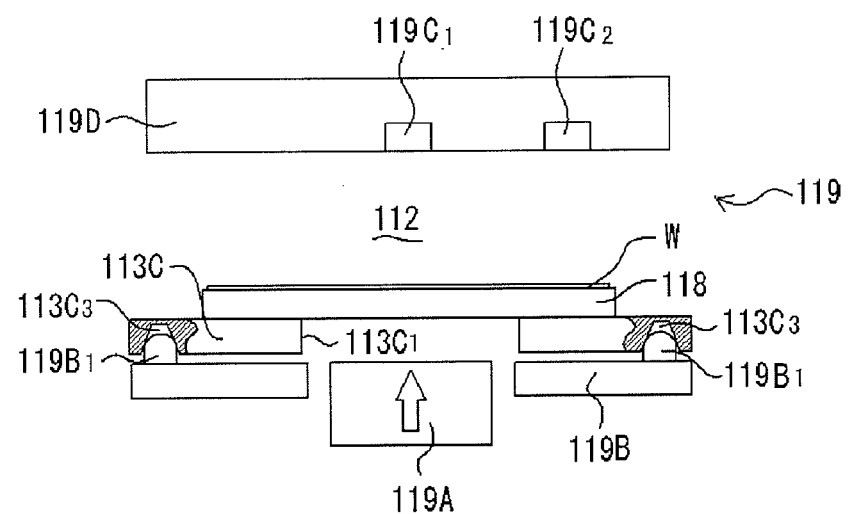
Figure 18A:
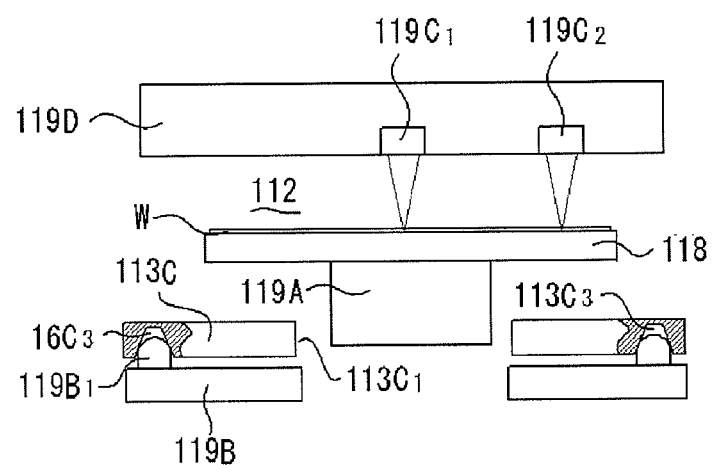
FIGS. 18A and 18B are views showing the process, which follows the process shown in FIGS. 16 A and 16B.
Figure 18B:
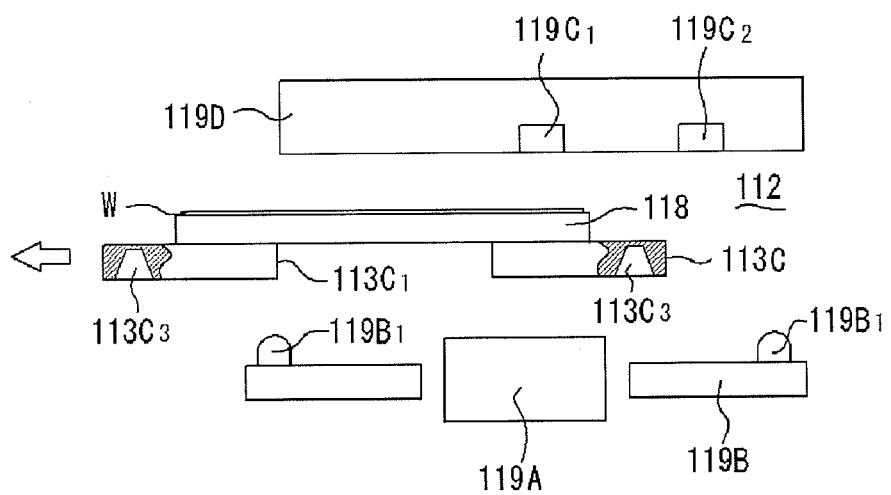

In the alignment area 112, for example, as shown in FIGS. 16A and 16B, an alignment mechanism 119 is mounted. The alignment mechanism 119, as shown above, includes a moving body 119A, a positioning member 119B with a number of projections $119B_1$, the first and the second cameras $119C_1$, $119C_2$, and a bridge 119D. Thus, the alignment mechanism 119 includes elements that are identical to the alignment mechanism 14 of the wafer inspection apparatus 10 of the first embodiment. This embodiment is different from the first embodiment in that the wafer retaining plate 118 is transferred to the alignment area 112 by the upper arm 113C of the wafer transfer mechanism 113, and the wafer W is aligned when the upper arm 113C is in a predetermined position in the alignment area 112. That is, the upper arm 113C corresponds to the supporting member 15B of the wafer retaining member 15 of the first embodiment.

In the alignment area 112, the upper arm 113C is in a certain position determined by the positioning member 119B. Thus, recesses $113C_3$ are formed on the bottom surface of the upper arm 113C in order to be coupled to a number of projections $119B_1$ of the positioning member 119B. When the upper arm 113C is advanced into the alignment area 112, a number of recesses $113C_3$ are coupled to and placed in the corresponding projections $119B_1$. Thus, the moving body 119A can pass through the hole $113C_1$ of the upper arm 113C, and move in an XY direction into the hole $113C_1$. The moving body 119A lifts up vertically from below the wafer retaining member 118, and returns to the original position when the wafer W is aligned, in the same manner as the first embodiment. The aligned wafer W is ejected from the alignment area 15 with the wafer retaining member 118 by the upper arm 113C, and then is transferred to the inspection area 114.

Further, the inspection area 114 has the same configuration as the first embodiment except for the mechanism that conveys aligned wafer W. That is, the inspection chamber 114 is provided with the same head plate 120, prove card 121, pogo pin block 122, locking ring 123 and seal member 124 as the first embodiment. The wafer transfer mechanism, which is not same as the first embodiment, is provided with a lifting body 125 that lifts the aligned wafer W with the wafer retaining support 118 vertically from the upper arm 113C of the wafer transfer mechanism 113 advanced into the inspection area 114, and a ring shaped positioning member 126 that surrounds the lifting body 125 and positions the upper arm 113C. A plurality of projections 126A which are to be coupled to the recesses $113C_3$ are formed along the circumferential direction at predetermined intervals. Such projections 126A are located at the same XY coordinates with the corresponding plurality of projections $119B_1$ of the positioning member 119B in the alignment area 112. Accordingly, the XY coordinates of the aligned wafer W in the alignment area 112 is reproduced in the inspection area.

That is, because there is a correlation between the XY coordinates in the inspection area and the XY coordinates in the alignment area 15, and the upper arm 113C is positioned and placed on the positioning member 57, a plurality of contacts of the wafer W certainly come in contact with a plurality of probes 1212A of the prove card 121 when the wafer W, which is aligned in the alignment area 112, on the wafer retaining support 118 is lifted by the lifting body 125.

Next, the operation will be explained. First, a housing F such as FOUP is loaded on the loading mechanism 111 of the wafer inspection apparatus 110. When inspecting the wafer W, the lower arm D loads the wafer W from the housing F one at a time. It transfers the wafer W, as shown in FIG. 15A, to the pre-alignment mechanism 115, where the wafer W is pre-aligned. Then, the wafer moving mechanism 116 is operated to grip and lift the aligned wafer W by the three gripping rods 116B as shown in FIG. 15B. In this case, the wafer transfer mechanism 113 is operated, and advances between the pre-alignment mechanism 115 and the wafer moving mechanism 116 with the upper arm 16C absorbing the wafer retaining support 118 and stops at the location where the center of the wafer W corresponds to the center of the wafer retaining support 118.

Next, the three gripping rods 116B of the wafer moving mechanism 116 is lowered, and the supporting portions 116B$_1$ of the three gripping rods 116B, respectively, pass through the cutout portion 118A of the wafer retaining support 118 and the small hole 113C$_2$ of the upper arm 113C. Accordingly, the wafer W is placed on the wafer retaining support 118. The three gripping rods 116B are stretched in the small hole 113C$_2$ of the upper arm 113C, and release the wafer W. Then, the three gripping rods 116 B are lifted up to the initial position as shown in FIG. 15C. When the wafer W is transferred onto the upper arm 113C of the second wafer transfer mechanism 113, the upper arm 113C returns to the initial position from the pre-alignment mechanism 115.

When the upper arm 113C of the wafer transfer mechanism 113 is advanced into a position right above the positioning member 119B and is lowered as shown in FIG. 16A, then the recesses 113C$_3$ of the upper arm 113C are coupled to the projections 119B$_1$ of the positioning member 119B. Thus, the positioning of the upper arm 113C in the alignment area 112 is performed automatically. After the positioning, the moving body 119A is lifted as indicated by the arrow in FIG. 16B. The moving body 119A is lifted and the wafer W is aligned through the first and second cameras 119C$_1$, 119C$_2$ as in the first embodiment. Then, while the moving body 119A is being lowered, the wafer retaining support 118 is guided onto the upper arm 113C and the moving body 119A returns to the initial position. Accordingly, the alignment of the wafer W is finished. After the alignment, the upper arm 113C, as indicated by the arrow in FIG. 18B, ejects the aligned wafer W with the wafer retaining support 118 from the alignment area 112, and transfers the aligned wafer W to the predetermined inspection area 114.

The upper arm 113C of the wafer transfer mechanism is advanced into the inspection chamber 114 as shown in FIG. 17 such that the recessed portions 113C$_3$ of the upper arm 113C and the projections 126A of the positioning member 126 reproduces the aligned XY coordinate position in the alignment chamber 112 within the inspection chamber 114. Thereafter, when the lifting body 125 lifts up the wafer retaining support 118 in a vertical direction, the outer periphery of the wafer makes an elastic contact with the seal member 124 so that a hermetically closed space is formed between the wafer W and the probe card 121. Then, as in the first embodiment, the hermetically closed space is depressurized such that the wafer W is vacuum-absorbed as to the seal member 124. In such a state, the lifting body 125 is lowered while retaining the wafer retaining support 118, and draws the wafer retaining support body 118 on the upper arm 113C. Then, while the upper arm 113C retreats from the inspection chamber 114, the lifting body 125 is lifted again such that the wafer W is pressurized against the probe card 121, which makes electrical contacts between a plurality of electrodes of the wafer W and a plurality of probes 121A so as to inspect electrical characteristics of the wafer W.

When the inspection is completed, the vacuum-absorption is released by an exhaustion means, and the hermetically closed space returns to a normal pressure. Then, while the lifting body 125 returns to its original position along with the inspection-completed wafer W, the lower arm 113D of the wafer transfer mechanism 113 receives the inspection-completed wafer W from the lifting body 125, retracts it from the inspection chamber 114, and transfers it the probe mark inspection chamber 117. After the probe mark inspection, the wafer W is transferred to the original position in the housing F on the loading mechanism 111 through the lower arm 113D. Through such sequential operations, the inspection of the wafer W is terminated. Subsequent wafers W are inspected in the same manner as indicated above.

As explained above, according to the second embodiment, the size of the transfer area can be reduced thereby achieving a compact space. Further, as the transfer area is reduced, a wafer transfer mechanism is simplified in terms of structure.

The present disclosure is not limited to the foregoing embodiments, and the design of the components may be modified as necessary. In the above embodiment, for example, the wafer is vacuum-adsorbed while being inspected, but the vacuumization can be stopped while the wafer is in pressure-contact with the sealing member by the lifting body. Moreover, the wafer inspection apparatus according to the present disclosure can be applicable to a burn-in inspection apparatus in terms of its structure.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method for pre-heating a probe card, for which an alignment chamber having an alignment mechanism configured to align a wafer at an inspection position of electrical characteristics inspection, and an inspection chamber configured to perform electrical characteristics inspection of the wafer are provided, the inspection chamber including: a probe card having a plurality of probes; a sealing member surrounding the plurality of probes; a lifting body configured to lift the wafer and bring the wafer into contact with the sealing member, the lifting body being capable of regulating temperature; and an exhaustion mechanism vacuumizing a hermetically closed space formed by the wafer, the sealing member, and the probe card,
   wherein the method uses the lifting body in the inspection chamber for electrical characteristics inspection of the wafer and comprises:
   lifting the wafer by the lifting body and bringing the wafer into contact with the sealing member;
   decompressing the interior of the hermetically closed space through the exhaustion mechanism to adsorb the wafer to the sealing member; and
   pre-heating the probe card so that the plurality of probes contact an upper surface of the wafer by the lifting body.

2. The method of claim 1, comprising aligning the wafer in the alignment chamber.

3. The method of claim 2, comprising transferring the wafer between the alignment chamber and the inspection chamber through a wafer retaining support.

4. The method of claim 3, comprising unloading the wafer retaining support from the inspection chamber after decompressing the interior of the hermetically closed space.

\* \* \* \* \*